(12) United States Patent
Koh et al.

(10) Patent No.: US 11,763,878 B2
(45) Date of Patent: Sep. 19, 2023

(54) SEMICONDUCTOR DEVICE INCLUDING SENSE AMPLIFIER HAVING ENHANCED SENSING MARGIN AND METHOD OF CONTROLLING THE SAME

(71) Applicants: SK hynix Inc., Icheon (KR); Seoul National University R&DB Foundation, Seoul (KR)

(72) Inventors: Daehyun Koh, Seoul (KR); Byungjun Kang, Seoul (KR); Yunhee Lee, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 91 days.

(21) Appl. No.: 17/469,742

(22) Filed: Sep. 8, 2021

(65) Prior Publication Data

US 2022/0343967 A1    Oct. 27, 2022

(30) Foreign Application Priority Data

Apr. 23, 2021    (KR) ........................ 10-2021-0052714

(51) Int. Cl.
*G11C 5/14* (2006.01)
*G11C 11/4091* (2006.01)
(Continued)

(52) U.S. Cl.
CPC ............ *G11C 11/4091* (2013.01); *G11C 5/14* (2013.01); *G11C 7/065* (2013.01); *G11C 7/18* (2013.01);
(Continued)

(58) Field of Classification Search
CPC ....... G11C 11/4091; G11C 5/14; G11C 7/065; G11C 7/18; G11C 11/4074; G11C 11/4094
See application file for complete search history.

(56) References Cited

U.S. PATENT DOCUMENTS 6,584,026 B2 *    6/2003    Kawasumi ............ G11C 11/412
                                                  327/55
9,202,531 B2    12/2015    Seo
(Continued)

OTHER PUBLICATIONS

J. Moon et al., "Sense amplifier with offset mismatch calibration for sub 1-V DRAM core operation," 2010 IEEE International Symposium on Circuits and Systems (ISCAS), 2010, pp. 3501-3504, Paris, France, doi: 10.1109/ISCAS.2010.5537834.

*Primary Examiner* — Mushfique Siddique

(57) ABSTRACT

A semiconductor device includes a first switch coupling a first switch coupling a first power source and a first node according to a first control signal; a sense amplifier coupled between the first node and a second node and performing a sensing operation; a second switch coupling a second power source and the second node according to a second control signal; and a sense amplifier control circuit providing the first control signal and the second control signal. The sense amplifier control circuit controls the second control signal so that a voltage of the second node reaches a shift voltage higher than a voltage of the second power source during a first sensing period of the sensing operation and a bias current flows through the second node during a second sensing period of the sensing operation. The sensing period is subsequent to the first sensing period.

18 Claims, 7 Drawing Sheets

(51) Int. Cl.
   *G11C 7/06*       (2006.01)
   *G11C 7/18*       (2006.01)
   *G11C 11/4094*    (2006.01)
   *G11C 11/4074*    (2006.01)

(52) U.S. Cl.
   CPC ...... *G11C 11/4074* (2013.01); *G11C 11/4094* (2013.01)

(56) References Cited

U.S. PATENT DOCUMENTS

| | | | | |
|---|---|---|---|---|
| 2009/0147604 | A1* | 6/2009 | Kang | G11C 7/08 |
| | | | | 365/205 |
| 2012/0188836 | A1* | 7/2012 | Lee | G11C 11/4091 |
| | | | | 365/207 |
| 2017/0032830 | A1* | 2/2017 | Lee | G11C 11/4074 |
| 2019/0214057 | A1* | 7/2019 | Won | G11C 8/12 |
| 2020/0227111 | A1 | 7/2020 | Kim et al. | |
| 2021/0050050 | A1* | 2/2021 | Na | G11C 11/4074 |
| 2022/0336007 | A1* | 10/2022 | Asaki | G11C 11/4091 |

\* cited by examiner

Present Embodiment

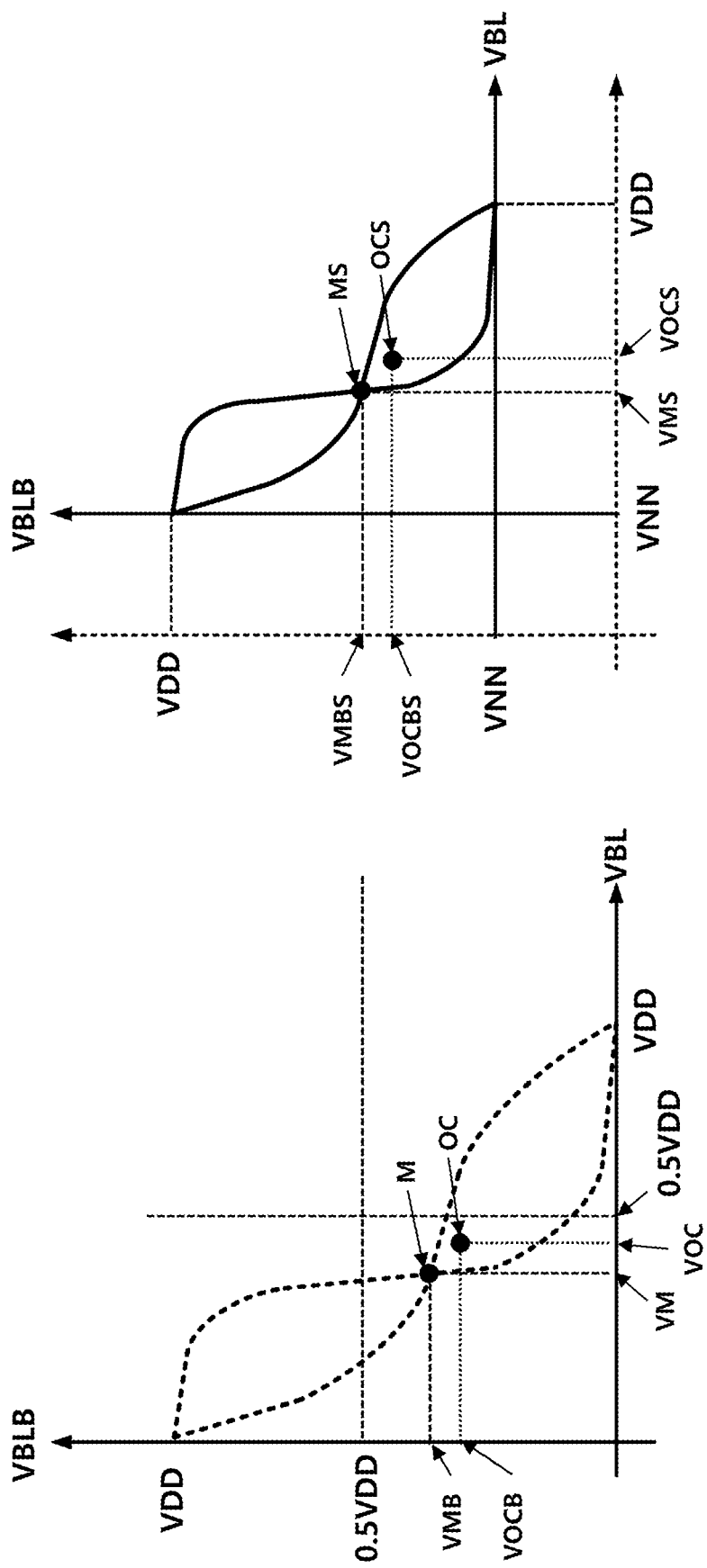

SEMICONDUCTOR DEVICE INCLUDING SENSE AMPLIFIER HAVING ENHANCED SENSING MARGIN AND METHOD OF CONTROLLING THE SAME

CROSS-REFERENCE TO RELATED APPLICATION

The present application claims priority under 35 U.S.C. § 119(a) to Korean Patent Application No. 10-2021-0052714, filed on Apr. 23, 2021, which is incorporated herein by reference in its entirety.

BACKGROUND

1. Technical Field

Various embodiments generally relate to a semiconductor device including a sense amplifier having enhanced sensing margin and a method controlling the semiconductor device.

2. Related Art

In a semiconductor device such as a Dynamic Random Access Memory (DRAM), a sense amplifier is used to sense and amplify a voltage of a bit line to determine cell data as 0 or 1.

In this case, an offset voltage of the sense amplifier is a bit line voltage that is difficult to clearly determine the cell data as 0 or 1, and may form a certain range.

Accordingly, for normal data sensing, the bit line voltage must deviate from the offset voltage range.

Accordingly, the offset voltage serves to reduce a sensing margin, which is a range in which data is normally determined by the sense amplifier.

In order to improve DRAM performance, a power supply voltage tends to decrease. For example, such a decreased power supply voltage may reduce power consumption in a DRAM device.

When the power supply voltage is further lowered, influence of the offset voltage increases and the sensing margin further decreases. Therefore, an offset cancelling operation is performed to improve the sensing margin.

However, in a conventional sense amplifier, even after performing the offset cancelling operation, a metastable point is formed at a point lower than a half of the power supply voltage due to the difference between the pull-down capability of an NMOS transistor and the pull-up capability of a PMOS transistor included in the sense amplifier.

Accordingly, in the conventional sense amplifier, a margin for sensing 0, which may be indicated as a 0-margin, may become significantly smaller than a margin for sensing 1, which may be indicated as a 1-margin, making it difficult to determine data 0.

SUMMARY

In accordance with an embodiment of the present disclosure, a semiconductor device may include a first switch coupling a first power source and a first node according to a first control signal; a sense amplifier coupled between the first node and a second node and performing a sensing operation; a second switch coupling a second power source and the second node according to a second control signal; and a sense amplifier control circuit providing the first control signal and the second control signal, wherein the sense amplifier control circuit controls the second control signal so that a voltage of the second node have a shift voltage higher than a voltage of the second power source during a first sensing period of the sensing operation and a bias current flows through the second node during a second sensing period of the sensing operation, the second sensing period being subsequent to the first sensing period.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate various embodiments, and explain various principles and beneficial aspects of those embodiments.

FIG. 3A illustrates a graph showing an operation of a conventional sense amplifier.

FIG. 3B illustrates a graph showing an operation of a sense amplifier according to an embodiment of the present disclosure.

DETAILED DESCRIPTION

The following detailed description references the accompanying figures in describing illustrative embodiments consistent with this disclosure. The embodiments are provided for illustrative purposes and are not exhaustive. Additional embodiments not explicitly illustrated or described and modifications are possible. The detailed description is not meant to limit this disclosure. Rather, the scope of the present disclosure is defined in accordance with claims and equivalents thereof. Also, throughout the specification, reference to "an embodiment" or the like is not necessarily to only one embodiment, and different references to any such phrase are not necessarily to the same embodiment(s).

Figure 1:
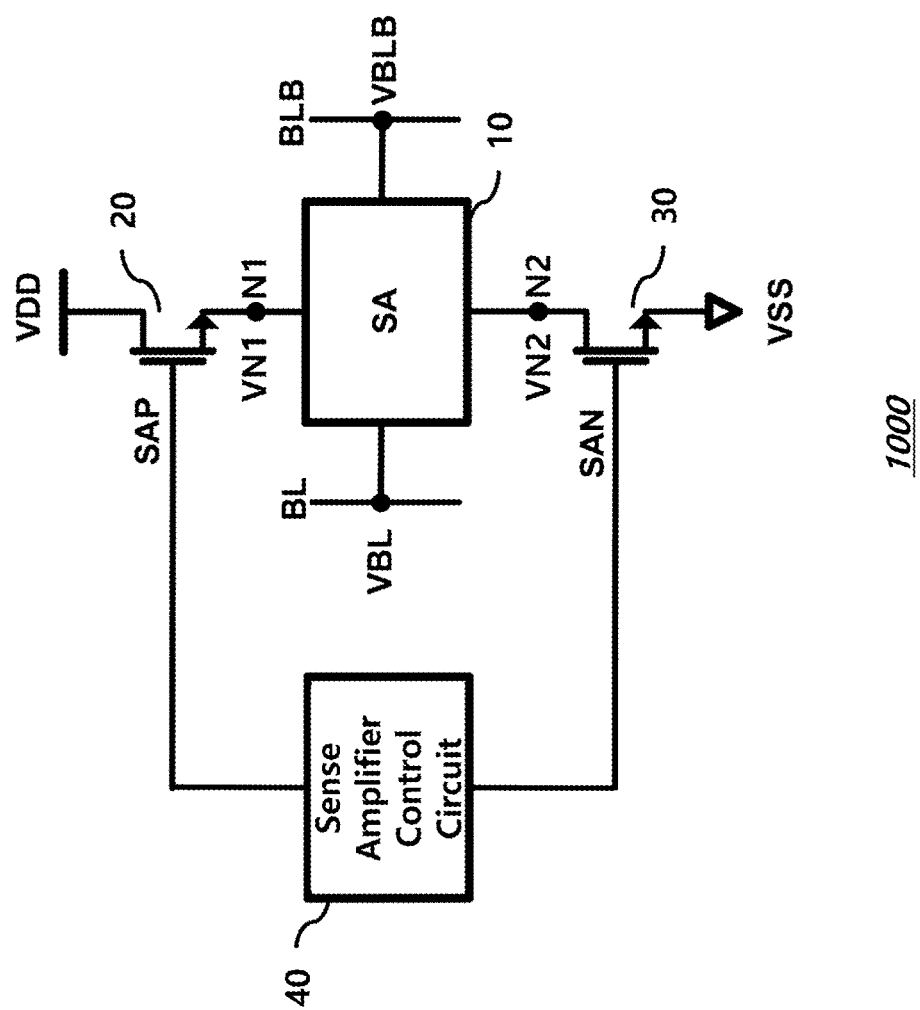
FIG. 1 illustrates a circuit diagram of a semiconductor device according to an embodiment of the present disclosure.

FIG. 1 illustrates a circuit diagram of a semiconductor device 1000 according to an embodiment of the present disclosure.

The semiconductor device 1000 in FIG. 1 includes a sense amplifier 10, a first switching device (e.g., a first switch) 20, a second switching device (e.g., a second switch) 30, and a sense amplifier control circuit 40.

The sense amplifier 10 is coupled between a first node N1 and a second node N2. The sense amplifier 10 senses and amplifies a voltage difference between a first bit line BL and a second bit line BLB paired with the first bit line BL.

The first switch 20 is coupled between a first power source VDD and the first node N1 and operates according to a first control signal SAP.

The second switch 30 is coupled between the second node N2 and a second power source VSS and operates according to a second control signal SAN.

The sense amplifier control circuit 40 provides the first control signal SAP and the second control signal SAN.

Hereinafter, a voltage of the first node N1 may be expressed as a first node voltage VN1, a voltage of the second node N2 may be expressed as a second node voltage VN2, a voltage of the first power source VDD may be expressed as a first power voltage VDD, and a voltage of the second power source VSS may be expressed as a second power voltage VSS.

Figures 2A, 2B:
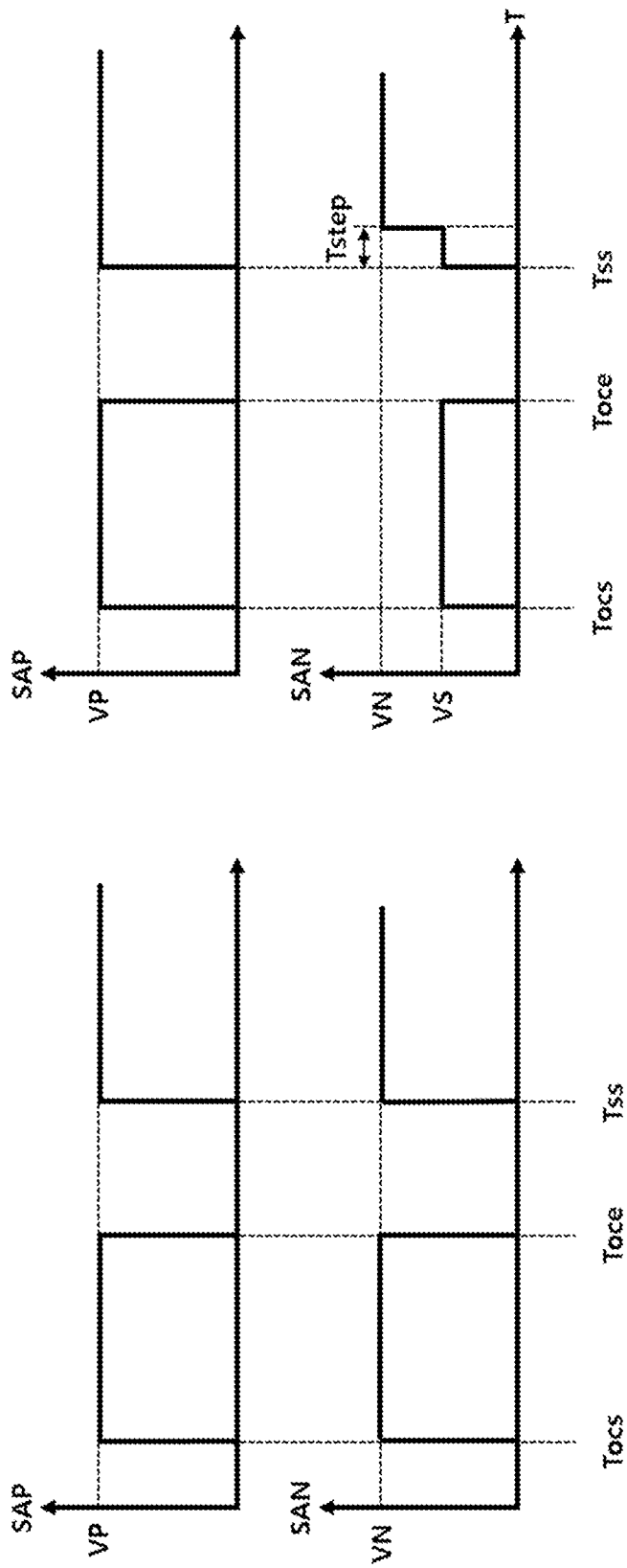
FIG. 2A illustrates a timing diagram showing an operation of a conventional semiconductor device.
FIG. 2B illustrates a timing diagram showing an operation of a semiconductor device according to an embodiment of the present disclosure.

FIG. 2A illustrates a timing diagram showing an operation of a conventional semiconductor device.

In FIG. 2A, an offset cancelling operation is performed between a first time Tocs and a second time Toce, and a sensing operation is performed after a third time Tss.

Conventionally, each of the first control signal SAP and the second control signal SAN has a high voltage enough to fully turn on a first switch and a second switch during the entire periods in which the offset cancelling operation and the sensing operation are performed.

A first voltage for fully turning on the first switch is denoted by VP, and a second voltage high enough to completely turn on the second switch is denoted by VN.

Accordingly, a sense amplifier in the conventional semiconductor device performs the operations substantially between the first power voltage VDD and the second power voltage VSS.

FIG. 2B illustrates a timing diagram showing an operation of a semiconductor device (e.g., the semiconductor device 1000 in FIG. 1) according to an embodiment of the present disclosure.

The sense amplifier control circuit 40 provides a voltage VP that is high enough to fully turn on the first switch 20 as the first control signal SAP during substantially the entire periods in which an offset cancelling operation and a sensing operation are performed.

Hereinafter, the voltage VP high enough to fully turn on the first switch 20 is referred to as a first turn-on voltage VP.

For example, when the first power voltage VDD is 1V, the first turn-on voltage VP may be set to 1.8V.

The sense amplifier control circuit 40 controls the second control signal SAN as will be described below.

First, during the offset cancelling operation from a first time Tocs and a second time Toce, a step voltage VS, which is a voltage smaller than a voltage VN that is sufficient to fully turn on the second switch 30, is provided as the second control signal SAN.

Hereinafter, the voltage VN high enough to fully turn on the second switch 30 is referred to as a second turn-on voltage VN.

In an embodiment, the second turn-on voltage VN may be in a range from 70% to 90% of the first power voltage VDD, and the step voltage VS may be in a range from 30% to 50% of the first power voltage VDD. For example, when the first power voltage VDD is 1V, the second turn-on voltage VN may be set to 0.8V and the step voltage VS may be set to 0.4V.

Thereafter, the step voltage VS is provided as the second control signal SAN for a predetermined time interval Tstep from the start of the sensing operation at a third time Tss.

Hereinafter, the predetermined time interval Tstep from the start time Tss of the sensing operation is referred to as a first sensing period.

The first sensing period Tstep is a period in which the sensing operation of the sense amplifier 10 is initialized. During the first sensing period, the situation during the offset cancelling operation is reproduced and the metastable point of the sense amplifier 10 is shifted by adjusting the operating voltage range of the sense amplifier 10. In an embodiment, the first sensing period Tstep may be sufficiently long to reproduce the situation during the offset cancelling operation and shift the metastable point of the sense amplifier 10 to a target value, and sufficiently short to avoid an excessive delay in performing the sensing operation. For example, the first sensing period Tstep may be in a range from 0.15 ns to 0.25 ns.

While the step voltage VS is provided as the second control signal SAN, the second switch 30 is not fully turned on and has a predetermined resistance, so that the voltage of the second node N2 has a predetermined level above the second power voltage VSS.

While the step voltage VS is provided as the second control signal SAN, the voltage of the second node N2 is denoted as a shift voltage VNN.

In this embodiment, for example, when the first power voltage VDD is 1V, the shift voltage VNN is set between 0.15 and 0.2V while the step voltage VS is being provided.

After the first sensing period Tstep, the second turn-on voltage VN is provided as the second control signal SAN in order to fully turn on the second switch 30.

A period in which the sense amplifier performs a sensing operation after the first sensing period Tstep is referred to as a second sensing period.

By fully turning on the second switch 30, the operation speed of the sense amplifier 10 can be improved.

FIG. 3A illustrates a graph showing an operation of a conventional sense amplifier.

Conventionally, since the first switch and the second switch are fully turned on, the sense amplifier operates substantially between the first power voltage VDD and the second power voltage VSS.

The curved dotted line indicates the operating characteristics of the sense amplifier, and the first bit line voltage VBL and the second bit line voltage VBLB at the metastable point M are denoted by VM and VMB, respectively.

By performing the offset cancelling operation, the initial values of the first bit line voltage VBL and the second bit line voltage VBLB move to the offset cancelling point OC adjacent to the metastable point M.

At this time, the first bit line voltage VBL and the second bit line voltage VBLB are expressed as VOC and VOCB, respectively.

As described above, even when the offset cancelling operation is performed, the metastable point M is formed below 0.5*VDD, thereby reducing 0-margin of the sense amplifier and making it difficult to determine data 0.

FIG. 3B illustrates a graph showing an operation of a sense amplifier (e.g., the sense amplifier 10 in FIG. 1) according to an embodiment of the present disclosure.

As described above referring to FIG. 2B, in the first sensing period Tstep, the first switch 20 is fully turned on, but the second switch 30 is not fully turned on, and as the voltage of the second node N2 becomes the shift voltage VNN.

Accordingly, as shown in FIG. 3B, the characteristic graph of the sense amplifier 10 is transformed into a form in which the origin is shifted by the shift voltage VNN in the horizontal and vertical directions.

In addition, the metastable point MS and the offset cancelling point OCS are also shifted in a similar manner.

In FIG. 3B, the first bit line voltage VBL and the second bit line voltage VBLB corresponding to the metastable point MS are indicated by VMS and VMBS, and the first bit line voltage VBL and the second bit line voltage VBLB at the offset cancelling point OCS are denoted by VOCS and VOCBS.

In this embodiment, preferably, a voltage VN2 of the second node N2 is set so that the metastable point MS be substantially at 0.5*VDD, and through this, the 0-margin and 1-margin are equally acquired when data is sensed. Specifically, the voltage VN2 of the second node N2 corresponding to the shift voltage VNN is set to make each of the first and second bit line voltages VBL and VBLB at the metastable point MS in a range from 45% to 55%, 47% to 53%, 49% to 51%, or 49.5% to 50.5% of the first power voltage VDD. For example, the shift voltage VNN may be set to be in a range from 15 to 20% of the first power voltage VDD.

In the embodiment of FIG. 2B, the sense amplifier control circuit 40 provides the second control signal SAN as a stepped waveform. Specifically, the sense amplifier control circuit 40 may provide the second control signal SAN having a waveform with two steps after the third time Tss. However, embodiments of the present disclosure are not limited thereto.

For example, a semiconductor device according to another embodiment may achieve substantially the same effect by generating a different waveform in the sense amplifier control circuit 40 from the waveform of the second control signal SAN.

Figure 4:
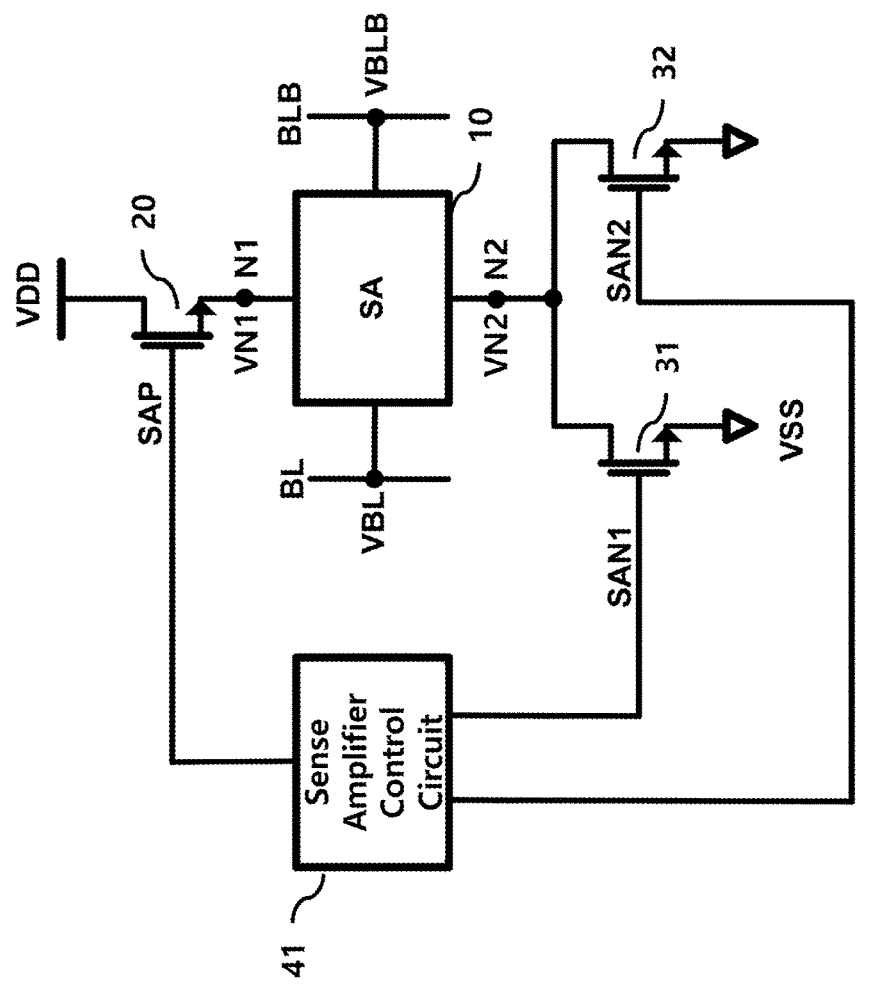
FIG. 4 illustrates a circuit diagram of a semiconductor device according to another embodiment of the present disclosure.

FIG. 4 illustrates a circuit diagram of a semiconductor device 2000 according to another embodiment of the present disclosure.

The semiconductor device 2000 includes a sense amplifier 10, a first switching device (e.g., a first switch) 20, a second switching device (e.g., a second switch) 31, a third switching device (e.g., a third switch) 32, and a sense amplifier control circuit 41.

The sense amplifier 10 is coupled between a first node N1 and a second node N2. The sense amplifier 10 senses and amplifies a voltage difference between the first bit line BL and the second bit line BLB paired with the first bit line BL.

The first switch 20 is coupled between a first power source VDD and the first node N1 and operates according to a first control signal SAP.

The second switch 31 is coupled between the second node N2 and a second power source VSS and operates according to a second control signal SAN1.

The third switch 32 is coupled between the second node N2 and the second power supply VSS and operates according to a third control signal SAN2.

The sense amplifier control circuit 41 provides the first control signal SAP, the second control signal SAN1, and the third control signal SAN2.

Figure 5:
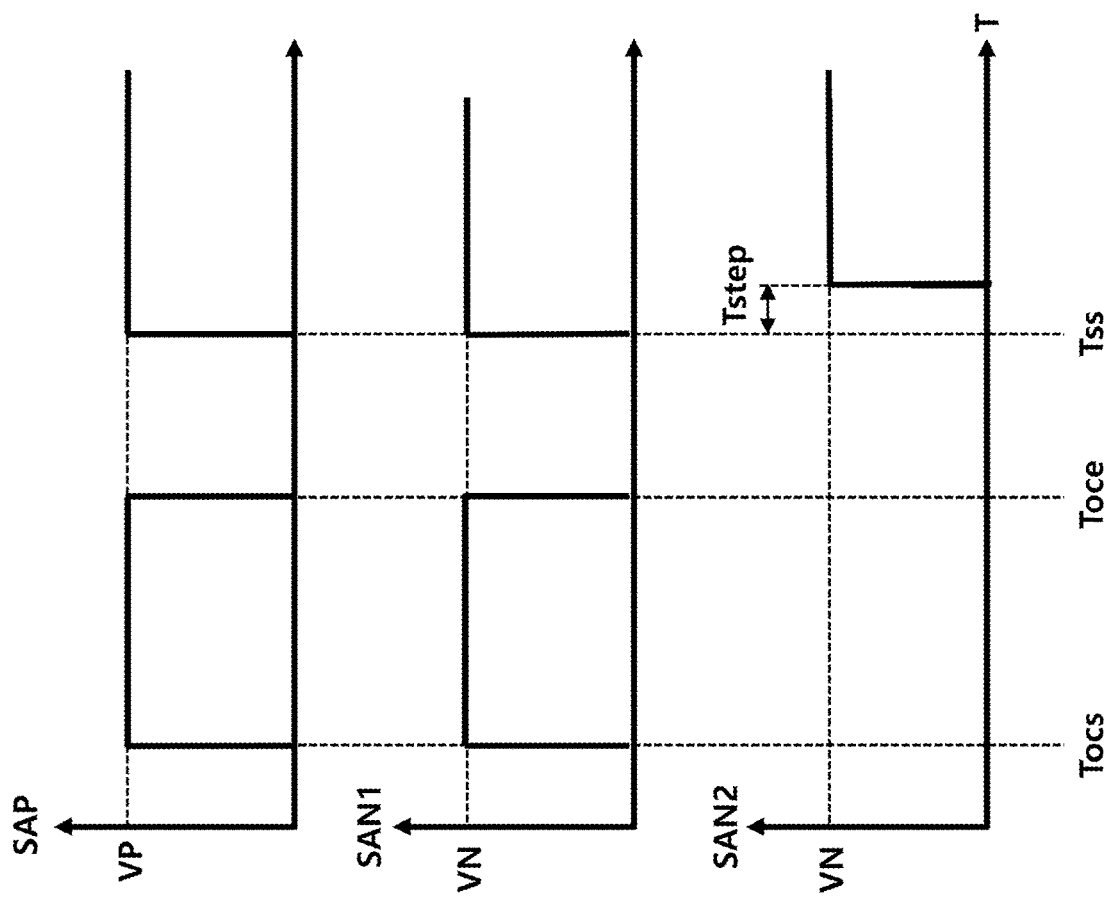
FIG. 5 illustrates a timing diagram showing an operation of a semiconductor device according to another embodiment of the present disclosure.

FIG. 5 illustrates a timing diagram showing an operation of a semiconductor device (e.g., the semiconductor device 2000 in FIG. 4) according to an embodiment of the present disclosure.

In this embodiment, an offset cancelling operation is performed between a first time Tocs and a second time Toce, and a sensing operation is performed after a third time Tss.

The sense amplifier control circuit 41 provides a first turn-on voltage VP as the first control signal SAP during substantially the entire period in which the offset cancelling operation and the sensing operation are performed.

The sense amplifier control circuit 41 provides the second control signal SAN1 and the third control signal SAN2.

First, during the offset cancelling operation, the step voltage VS may be provided as the second control signal SAN1. This is a case where the size of the second switch 30 of FIG. 1 and the size of the second switch 31 of FIG. 4 are the same. Specifically, when the size of the second switch 30 in FIG. 1 is substantially the same as that of the second switch 31 in FIG. 4, the step voltage VS in FIG. 2B that is applied to the second switch 30 may be also applied to the second switch 31 as the second control signal SAN1 during the offset cancelling operation.

In contrast, as shown in the embodiment of FIGS. 4 and 5, the second turn-on voltage VN may be used as the second control signal SAN1 and the third control signal SAN2, but the size of the second switch 31 and the size of the third switch 32 may be adjusted accordingly. For example, when the channel width of the second switch 31 in FIG. 4 is smaller than that of the second switch 30 in FIG. 1, the second turn-on voltage VN that is greater than the step voltage VS in FIG. 2B may be used as the second control signal SAN1 during the offset cancelling operation.

In an embodiment, the size of the second switch 31 and third switch 32 in FIG. 4 may be adjusted such that the sum of sizes of the second and third switches 31 and 32 in FIG. 4 is substantially equal to a size of the second switch 30 in FIG. 1. For example, when the channel width of a first MOS transistor in the second switch 30 of FIG. 1 is 7.5 micrometers, the channel width of a second MOS transistor in the second switch 31 of FIG. 4 is 2.5 micrometers, and the channel width a third MOS transistor in the third switch 32 of FIG. 4 is 5 micrometers.

Magnitudes of the second control signal SAN1 and the third control signal SAN2 and the channel widths of MOS transistors in the switches may be variously changed according to embodiments.

During the offset cancelling operation, the third switch 32 is turned off by providing a given voltage (e.g., 0V) as the third control signal SAN2.

Thereafter, the second turn-on voltage VN is provided as the second control signal SAN1 for a predetermined time interval Tstep, which corresponds to a first sensing period, from the third time Tss when the sensing operation starts.

During the first sensing period, the third control signal SAN2 is 0V and the third switch 32 is turned off.

Since the channel width of the second MOS transistor in the second switch 31 decreases, even if the second turn-on voltage VN is provided as the second control signal SAN1, the voltage of the second node N2 may be set to the shift voltage VNN. Specifically, since the channel width of the MOS transistor in the second switch 31 in FIG. 4 is smaller than that of the first MOS transistor in the second switch 30 in FIG. 1, the second turn-on voltage VN, which is greater than the step voltage VS applied to the first MOS transistor in the second switch 30, may be provided to the second switch 31 in FIG. 4 as the second control signal SAN1 to set the voltage of the second node N2 substantially equal to the shift voltage VNN.

In an embodiment, the voltage of the second node N2, that is, the shift voltage VNN, is set to be 0.15 to 0.2V during the first sensing period.

As described above, the first sensing period is a period in which the sensing operation of the sense amplifier 10 is initialized. During the first sensing period, the situation during the offset cancelling operation is reproduced and the metastable point of the sense amplifier 10 is shifted by adjusting the operating voltage range of the sense amplifier 10.

During the second sensing period after the first sensing period, the second turn-on voltage VN is provided as the second control signal SAN1 to the second switch 31.

During the second sensing period, the third control signal SAN2 provided to the third switch 32 is set to the second turn-on voltage VN. Although FIG. 5 shows both the second control signal SAN1 and the third control signal SAN2 are each set to the second turn-on voltage VN, embodiments of the present disclosure are not limited thereto. In other embodiments, the third control signal SAN2 may be set to a given voltage that is different from the second turn-on voltage VN of the second controls signal SAN1, provided that the given voltage of the third control signal SAN2 is sufficiently high to fully turn on the third switch 32.

Accordingly, by activating the second switch 31 and the third switch 32 together during the second sensing period, a bias current flowing through the second node N2 may be increased, thereby improving the operating speed of the sense amplifier 10.

Figure 6:
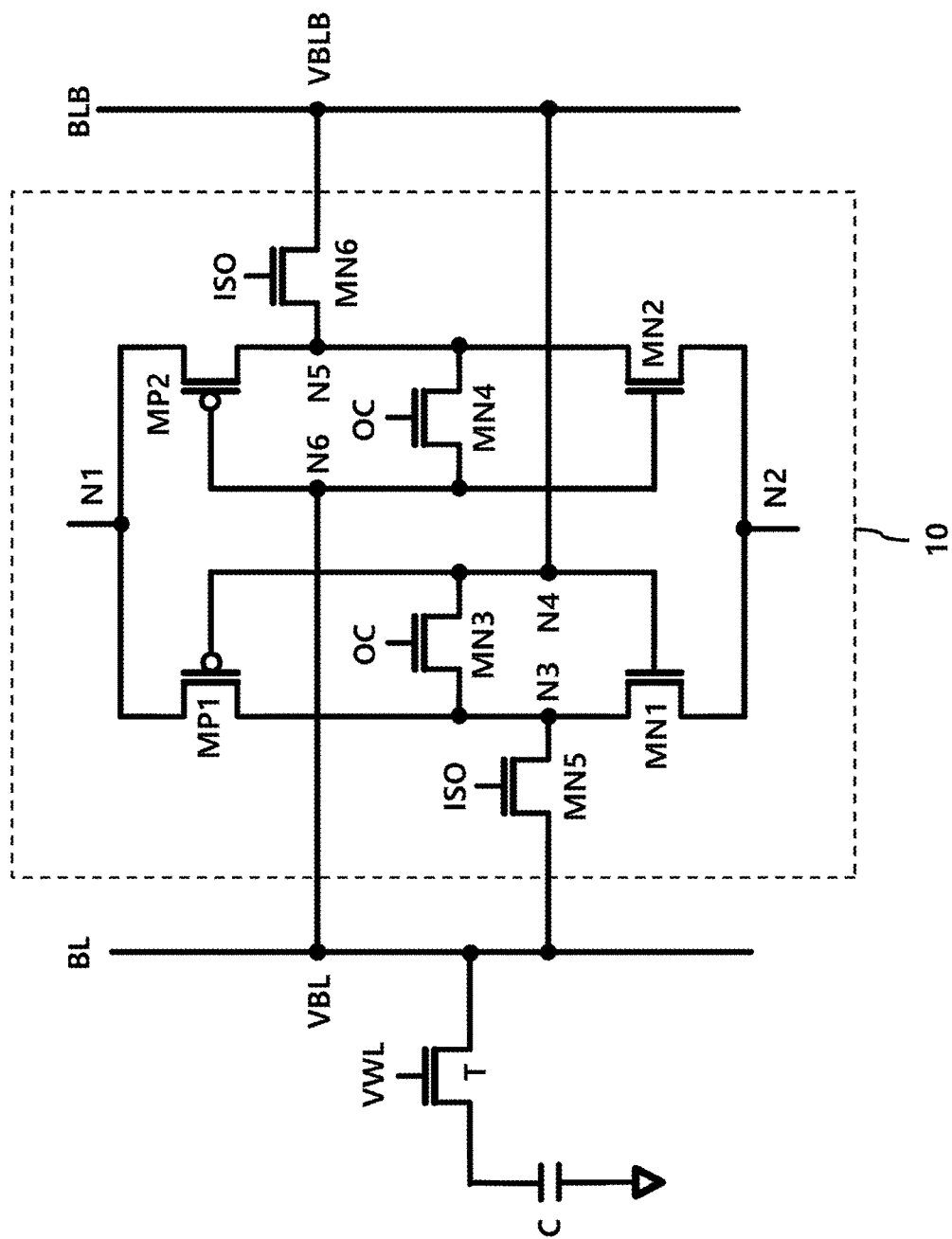
FIG. 6 illustrates a circuit diagram of a sense amplifier according to another embodiment of the present disclosure.

FIG. 6 illustrates a circuit diagram of a sense amplifier 10 according to another embodiment of the present disclosure. The sense amplifier 10 in FIG. 6 may be suitable for use as the sense amplifier 10 in FIG. 1 and the sense amplifier 10 in FIG. 4.

The sense amplifier 10 includes a PMOS transistor MP1 and an NMOS transistor MN1 coupled between a first node N1 and a second node N2 to form a first inverter and includes a PMOS transistor MP2 and an NMOS transistor MN2 coupled between the first node N1 and the second node N2 to form a second inverter.

In FIG. 6, an input terminal of the first inverter corresponds to a third node N3, an output terminal of the first inverter corresponds to a fourth node N4, an input terminal of the second inverter corresponds to a fifth node N5, and an output terminal of the second inverter corresponds to a sixth node N6.

The sense amplifier 10 further includes an NMOS transistor MN3 having a gate receiving an offset cancelling control signal OC and a source and a drain coupled between the third node N3 and the fourth node N4 and an NMOS transistor MN4 having a gate receiving the offset cancelling control signal OC and a source and a drain coupled between the fifth node N5 and the sixth node N6.

During the above-described offset cancelling operation, the offset cancelling control signal OC is activated.

The sense amplifier 10 further includes an NMOS transistor MN5 having a gate receiving an input control signal ISO and a source and a drain coupled between the third node N3 and the first bit line BL and an NMOS transistor MN6 having a gate receiving the input control signal ISO and a source and a drain coupled between the fifth node N5 and the second bit line BLB.

The input control signal ISO is activated in the above-described first and second sensing periods to apply the first bit line voltage VBL to the third node N3 and to apply the second bit line voltage VBLB to the fifth node N5 to start the sensing operation of the sense amplifier 10.

The offset cancelling control signal OC and the input control signal ISO may be provided from a sense amplifier control circuit (e.g., the sense amplifier control circuit 40 in FIG. 1).

In FIG. 6, a cell capacitor C and a cell transistor T coupled to the first bit line BL are shown together. The word line voltage VWL is applied to the gate of the cell transistor T.

Figure 7:
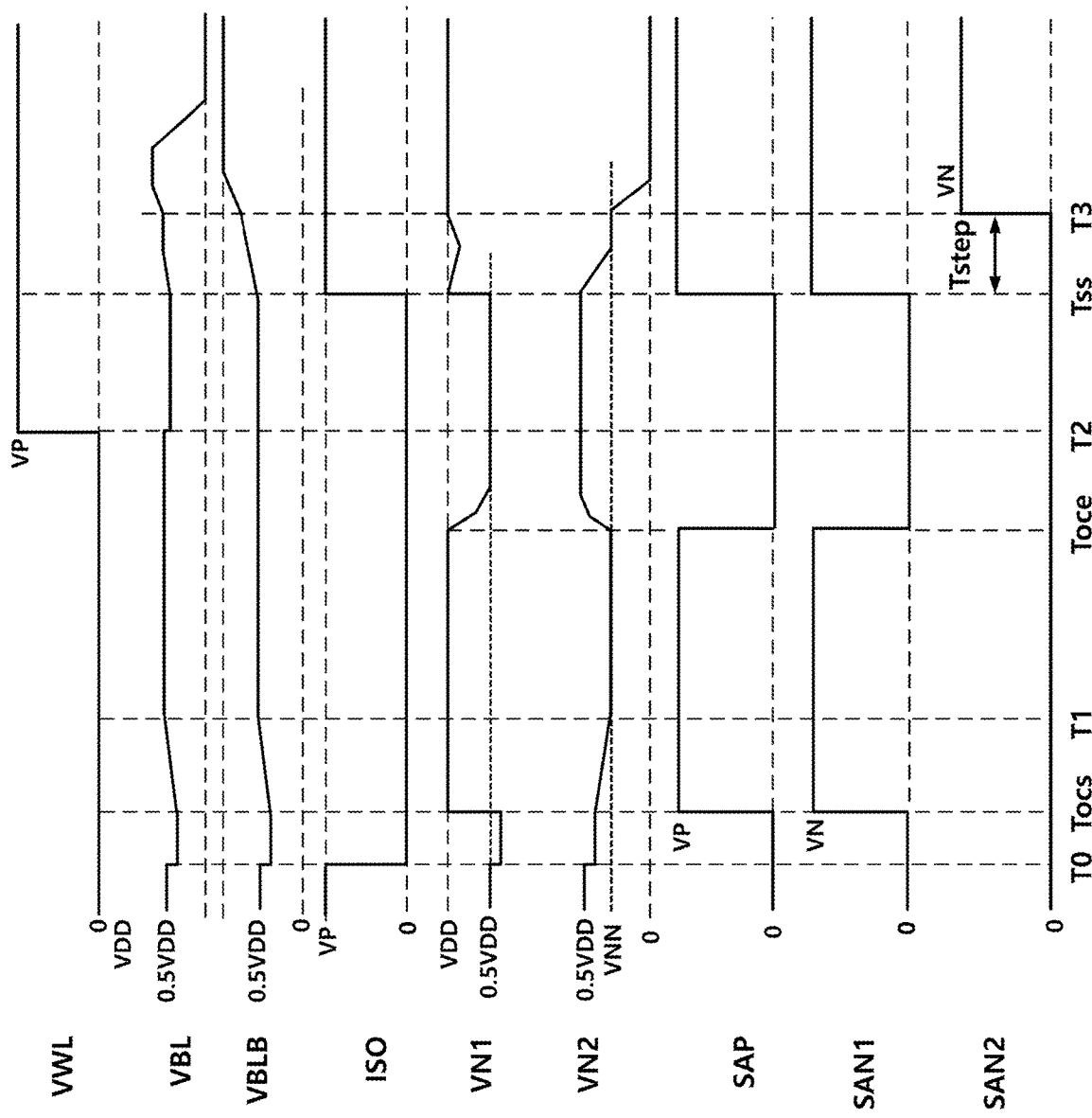
FIG. 7 illustrates a timing diagram showing an operation of a semiconductor device according to an embodiment of the present disclosure.

FIG. 7 illustrates a timing diagram showing an operation of a semiconductor device according to an embodiment of the present disclosure.

Hereinafter, the operation of the semiconductor device 2000 will be described with reference to FIGS. 4 and 6.

Before T0, the input control signal ISO is activated as the first turn-on voltage VP, and the first bit line voltage VBL and the second bit line voltage VBLB are precharged to 0.5*VDD.

At this time, since the first switch 20, the second switch 31, and the third switch 32 are all turned off, the first node voltage VN1 and the second node voltage VN2 are also precharged to 0.5*VDD.

As the input control signal ISO drops to 0V at T0, the first and second bit lines BL and BLB are decoupled from the sense amplifier 10, and the first bit line voltage VBL and the second bit line voltage are VBLB, the first node voltage VN1, and the second node voltage VN2 decrease.

As the offset cancelling operation starts at Tocs, the first turn-on voltage VP is applied as the first control signal SAP, and the second turn-on voltage VN is applied as the second control signal SAN1.

Accordingly, the first node voltage VN1 rises to the first power voltage VDD, and the second node voltage VN2 gradually decreases and converges to the shift voltage VNN at T1.

At this time, the shift voltage VNN is a voltage between 0.5*VDD and 0V.

At Tocs, the offset cancelling control signal OC of FIG. 6 is activated so that the third node N3 and the fourth node N4 become coupled, and the fifth node N5 and the sixth node N6 become coupled.

Accordingly, the first bit line voltage VBL and the second bit line voltage VBLB rise again to 0.5*VDD.

At Toce, the offset cancelling operation ends.

Accordingly, the first control signal SAP, the second control signal SAN1, the third control signal SAN2, and the offset cancelling control signal OC are all set to 0V.

Accordingly, the first node voltage VN1 and the second node voltage VN2 converge to 0.5*VDD.

At T2, the first turn-on voltage VP is applied as the word line voltage VWL, and thus the cell capacitor C and the first bit line BL are coupled.

In FIG. 7, it is assumed that no charge is stored in the cell capacitor C, which corresponds to data 0, and accordingly, the first bit line voltage VBL decreases at T2.

At Tss, the first sensing period is started, and the input control signal ISO rises to the first turn-on voltage VP.

At this time, the first turn-on voltage VP is applied as the first control signal SAP, the second turn-on voltage VN is applied as the second control signal SAN1, and 0V is applied as the third control signal SAN2.

In addition, the first bit line BL is coupled to the third node N3 and the second bit line BLB is coupled to the fifth node N5 to start a sensing operation.

Accordingly, the first node voltage VN1 rises to the first power voltage VDD, and before the step period Tss elapses, the second node voltage VN2 converges to the shift voltage VNN.

At this time, the shift voltage VNN is located between 0.5*VDD and the ground voltage, which is a second power voltage VSS, and serves to shift the metastable point of the sense amplifier 10 substantially to 0.5*VDD.

The step period Tstep elapses and the second sensing period starts at T3.

At this time, as the second turn-on voltage VN is applied as the third control signal SAN2, the bias current flowing through the second node N2 increases, and the second node voltage VN2 gradually decreases.

During this period, the sensing operation is performed quickly, and finally, the first bit line voltage VBL converges to 0V, and the second bit line voltage VBLB converges to VDD.

In an embodiment, a method of controlling a semiconductor device includes providing a first control signal to a first switching device, the first control signal having a first voltage during a first sensing period of a sensing operation, and providing a second control signal to a second switching device, the second control signal having a second voltage during the first sensing period of the sensing operation, the second control signal having a third voltage during a second sensing period of the sensing operation subsequent to the first period, the third voltage being higher than the second voltage.

In an embodiment, the method further includes performing an offset canceling operation before the sensing operation. The second control signal has the second voltage during the offset canceling operation.

In an embodiment, the second voltage of the second control signal is greater than a voltage of the second power source.

In an embodiment, the third voltage of the second control signal is sufficiently high to fully turn on the second switching device.

In an embodiment, the first sensing period is in a range from 0.15 ns to 0.25 ns.

In an embodiment, the method further includes providing a third control signal to the third switching device, the third control signal having a fourth voltage during the offset canceling operation and during the first sensing period and the second sensing period of the sensing operation.

In an embodiment, the method further includes causing a voltage of the second node to reach a shift voltage during the first sensing period of the sensing operation according to the second voltage of the second control signal, the shift voltage being higher than a voltage of the second power source.

In an embodiment, the method further includes shifting a metastable point of the sense amplifier substantially to a half of a voltage of the first power source.

Although various embodiments have been illustrated and described, various changes and modifications may be made to the described embodiments without departing from the spirit and scope of the invention as defined by the following claims.

What is claimed is:

1. A semiconductor device comprising:
a first switch coupling a first power source and a first node according to a first control signal;
a sense amplifier coupled between the first node and a second node and performing a sensing operation;
a second switch coupling a second power source and the second node according to a second control signal; and
a sense amplifier control circuit providing the first control signal and the second control signal,
wherein the sense amplifier control circuit controls the second control signal, so that a voltage of the second node reaches a shift voltage higher than a voltage of the second power source during a first sensing period of the sensing operation and a bias current flows through the second node during a second sensing period of the sensing operation, the second sensing period being subsequent to the first sensing period,
wherein the sense amplifier further performs an offset cancelling operation before the sensing operation, and
wherein the sense amplifier control circuit controls the second control signal so that the voltage of the second node reaches the shift voltage during the offset cancelling operation.

2. The semiconductor device of claim 1, wherein the second switch includes a first metal-oxide-silicon (MOS) transistor having a source and a drain that are coupled between the second node and the second power source and a gate that receives the second control signal, and
wherein the sense amplifier control circuit controls the second control signal so that a voltage difference between the source and the drain of the first MOS transistor reaches the shift voltage.

3. The semiconductor device of claim 2, wherein the first MOS transistor is an NMOS transistor and the sense amplifier control circuit controls the second control signal to have a first voltage during the first sensing period and a second voltage during the second sensing period, the second voltage being higher than the first voltage.

4. The semiconductor device of claim 1, further comprising a third switch coupling the second node and the second power source according to a third control signal,
wherein the sense amplifier control circuit controls the second control signal and the third control signal, so that the voltage of the second node reaches the shift voltage during the first sensing period and the bias current flowing through the second node increases during the second sensing period.

5. The semiconductor device of claim 4, wherein the second switch includes a second MOS transistor having a source and a drain that are coupled between the second node and the second power source and a gate that receives the second control signal,
wherein the third switch includes a third MOS transistor having a source and a drain that are coupled between the second node and the second power source and a gate that receives the third control signal, and
wherein the sense amplifier control circuit controls the second control signal so that a voltage difference between the source and the drain of the second MOS transistor reaches the shift voltage during the first sensing period, and controls the third control signal so that the bias current flowing through the second node increases during the second sensing period.

6. The semiconductor device of claim 5, wherein the second MOS transistor and the third MOS transistor are NMOS transistors, and
wherein the sense amplifier control circuit controls the second control signal to have a first voltage during the first sensing period and the second sensing period, and controls the third control signal to have a second voltage during the first sensing period and a third voltage during the second sensing period, the third voltage being higher than the second voltage.

7. The semiconductor device of claim 6, wherein a channel width of the third MOS transistor is greater than a channel width of the second MOS transistor.

8. The semiconductor device of claim 4,
wherein the sense amplifier control circuit controls the second control signal and the third control signal so that the voltage of the second node reaches the shift voltage during the offset cancelling operation.

9. The semiconductor device of claim 8, further comprising a cell capacitor configured to be coupled to a first bit line according to a word line signal, wherein the first bit line is coupled to the cell capacitor at a specific time after the offset cancelling operation and before the sensing operation.

10. The semiconductor device of claim 9, wherein the sense amplifier comprises:
a first inverter coupled between the first node and the second node;
a second inverter coupled between the first node and the second node;
a first NMOS transistor coupling an input node and an output node of the first inverter according to an offset cancelling control signal;
a second NMOS transistor coupling an input node and output node of the second inverter according to the offset cancelling control signal;
a third NMOS transistor coupling the input node of the first inverter and the first bit line according to an input control signal; and
a fourth NMOS transistor coupling the input node of the second inverter and a second bit line according to the input control signal.

11. A semiconductor device comprising:
a first switch coupling a first power source and a first node according to a first control signal;
a sense amplifier coupled between the first node and a second node and performing a sensing operation;
a second switch coupling a second power source and the second node according to a second control signal; and
a sense amplifier control circuit providing the first control signal and the second control signal,
wherein the sense amplifier control circuit controls the second control signal, so that a voltage of the second node reaches a shift voltage higher than a voltage of the second power source during a first sensing period of the sensing operation and a bias current flows through the second node during a second sensing period of the sensing operation, the second sensing period being subsequent to the first sensing period, and
wherein a metastable point of the sense amplifier is substantially in the middle of a voltage of the first power source and the voltage of the second power source.

12. A method of controlling a semiconductor device, wherein the semiconductor device comprising a first switching device coupled between a first power source and a first node, a second switching device coupled between a second power source and a second node, and a sense amplifier coupled between the first and second nodes, the method comprising:
providing a first control signal to the first switching device, the first control signal having a first voltage during a first sensing period of a sensing operation;
providing a second control signal to the second switching device, the second control signal having a second voltage during the first sensing period of the sensing operation, the second control signal having a third voltage during a second sensing period of the sensing operation subsequent to the first period, the third voltage being higher than the second voltage; and
performing an offset canceling operation before the sensing operation,
wherein the second control signal has the second voltage during the offset canceling operation.

13. The method of claim 12, wherein the second voltage of the second control signal is greater than a voltage of the second power source.

14. The method of claim 13, wherein the third voltage of the second control signal is sufficiently high to fully turn on the second switching device.

15. The method of claim 12, wherein the first sensing period is in a range from 0.15 ns to 0.25 ns.

16. The method of claim 12, wherein the semiconductor device further comprises a third switching device coupled between the second node and the second power source, the method further comprising:
providing a third control signal to the third switching device, the third control signal having a fourth voltage during the offset canceling operation and during the first sensing period and the second sensing period of the sensing operation.

17. The method of claim 12, further comprising:
causing a voltage of the second node to reach a shift voltage during the first sensing period of the sensing operation according to the second voltage of the second control signal, the shift voltage being higher than a voltage of the second power source.

18. The method of claim 17, wherein a voltage of the second power source is a ground voltage, the method further comprising:
shifting a metastable point of the sense amplifier substantially to a half of a voltage of the first power source.

* * * * *